US007307266B1

(12) United States Patent
Sun et al.

(10) Patent No.: US 7,307,266 B1
(45) Date of Patent: Dec. 11, 2007

(54) METHOD AND APPARATUS FOR AN OPTICALLY CLOCKED OPTOELECTRONIC TRACK AND HOLD DEVICE

(75) Inventors: Chen-Kuo Sun, Escondido, CA (US); Richard C. Eden, Braircliff, TX (US); Ching-Ten Chang, San Diego, CA (US); Donald J. Albares, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 339 days.

(21) Appl. No.: 10/730,713

(22) Filed: Nov. 26, 2003

(51) Int. Cl.
*G02B 27/00* (2006.01)
*G02B 6/28* (2006.01)
*G01J 1/04* (2006.01)
*G11C 27/02* (2006.01)
*H03K 17/74* (2006.01)
*H03M 1/00* (2006.01)

(52) U.S. Cl. .................. 250/551; 250/227.14; 327/92; 327/494; 341/133; 385/24; 307/353

(58) Field of Classification Search ......... 250/214 DC, 250/214 LS, 214 SW, 227.14, 551; 327/515, 327/516, 92, 93, 94, 494; 341/124, 133, 341/143; 385/16, 23, 24; 307/353
See application file for complete search history.

(56) References Cited

U.S. PATENT DOCUMENTS

| 3,721,829 | A | * | 3/1973 | Benson ........................ 327/92 |
| 4,659,945 | A | * | 4/1987 | Metz ............................ 327/92 |
| 4,727,349 | A | * | 2/1988 | MacDonald et al. .......... 338/15 |
| 5,007,037 | A |   | 4/1991 | Lindmayer |
| 5,239,181 | A | * | 8/1993 | Sun et al. .................... 250/551 |
| 5,455,584 | A | * | 10/1995 | Taddiken .................... 341/200 |
| 6,097,857 | A |   | 8/2000 | Feldman |
| 6,528,779 | B1 |   | 3/2003 | Franz et al. |

* cited by examiner

*Primary Examiner*—Georgia Epps
*Assistant Examiner*—Don Williams
(74) *Attorney, Agent, or Firm*—Peter A. Lipovsky; J. Eric Anderson; Allan Y. Lee

(57) ABSTRACT

A method and apparatus for optically clocked optoelectronic track and hold ("OCOETH") device. The OCOETH device includes a diode bridge, input node, at least two current sources and at least two photodetectors. The input node is operatively coupled to the diode bridge and can receive an analog input signal. The at least two current sources are operatively coupled to the diode bridge and can forward bias the diode bridge. The at least two photodetectors are operatively coupled to the diode bridge and can receive an optical input clocking signal, and can reverse bias and forward bias the diode bridge in response to the optical input clocking signal. The hold capacitor is operatively coupled to the diode bridge and can track the analog input signal when the diode bridge is forward biased, and can hold the analog input signal when the diode bridge switches from forward biased to reverse biased.

8 Claims, 7 Drawing Sheets

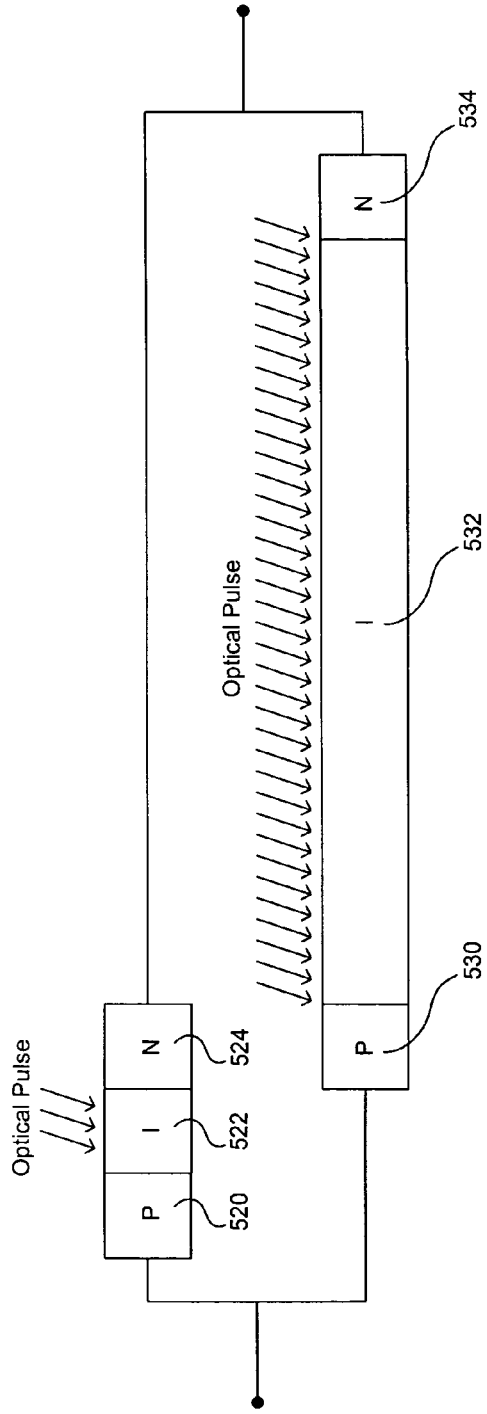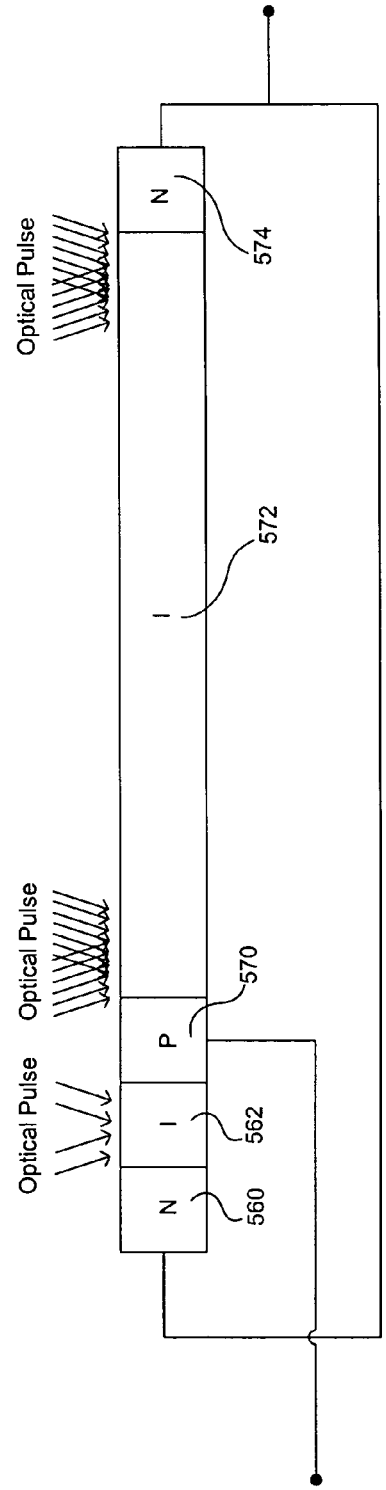
FIG. 5A
FIG. 5B

METHOD AND APPARATUS FOR AN OPTICALLY CLOCKED OPTOELECTRONIC TRACK AND HOLD DEVICE

BACKGROUND OF THE INVENTION

The present invention is generally in the field of analog-to-digital converter systems. More specifically, the invention is in the field of optically clocked optoelectronic track and hold devices in analog-to-digital conversion systems.

Signal processing is the analysis and/or modification of sensory information. Signal processing applications include space photograph enhancement, medical diagnostic imaging (e.g., CT, MRI and ultrasound), movie special effects, telephone voice and data compression, speech recognition, radar, sonar, oil and mineral prospecting and earthquake recording and analysis. Most signal processing applications receive sensory data from real-world phenomena (e.g., sound waves, seismic vibrations and RF waves) as analog signals. Signal processing systems typically convert analog signals to digital signals using analog-to-digital converters for processing by digital signal processing ("DSP") systems.

A typical analog-to-digital converter (ADC) receives an analog input signal and a clock signal and outputs a digital signal comprising a discrete sequence of measured values, which represents the analog input signal measured at time intervals that are based on the clock signal. A typical ADC includes an electronic track and hold ("TH") device and a quantizer. A diode bridge circuit is commonly used in TH devices. An electronic TH device receives an electronic clock signal that switches the electronic TH device from a track mode to a hold mode via electronic switches. When operating in track mode, the electronic TH device continuously measures an analog signal. When operating in hold mode, the electronic TH device holds the measured value of the analog signal. The quantizer assigns measured values to multiples of a basic unit.

Disadvantageously, electronic TH devices switch slowly due to slow rise times of electronic clocking, resulting in a relatively long aperture time (i.e., the time for the track-to-hold transition). In addition, electronic clock signals suffer from aperture jitter (i.e., error in the timing of the initiation of the track-to-hold transition) due to clock inaccuracies. Further, electronic clock signals can disadvantageously interfere with analog input signals (e.g., cross talk).

Therefore, a need exists for track and hold devices that can quickly switch between track mode and hold mode. In addition, a need exists for track and hold devices that reduce aperture jitter. Further, a need exists for track and hold devices that reduce interference with analog input signals.

BRIEF DESCRIPTION OF THE DRAWINGS

FIG. 5A is an exemplary photodiode that can be used to implement an optically clocked optoelectronic track and hold device.

FIG. 5B is an exemplary photodiode that can be used to implement an optically clocked optoelectronic track and hold device.

DETAILED DESCRIPTION OF THE INVENTION

The present invention is directed to a method and apparatus for optically clocked optoelectronic track and hold devices. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

The present inventive method and apparatus for optically clocked optoelectronic track and hold devices uses photodiodes to switch between track mode and hold mode. In one embodiment, the present invention is capable of quickly switching between track mode and hold mode. In one embodiment, the present invention is capable of reducing interference of a clock signal with analog input signals. In one embodiment, the present invention reduces aperture jitter. In one embodiment, the present invention has low distortion due to reduced signal averaging and less diode bridge nonlinear feed through for picosecond aperture times. In one embodiment, the present invention improves track and hold precision for signals having high frequencies (e.g., greater than 100 MHz). The present invention is particularly useful in ADC systems.

Figure 1:
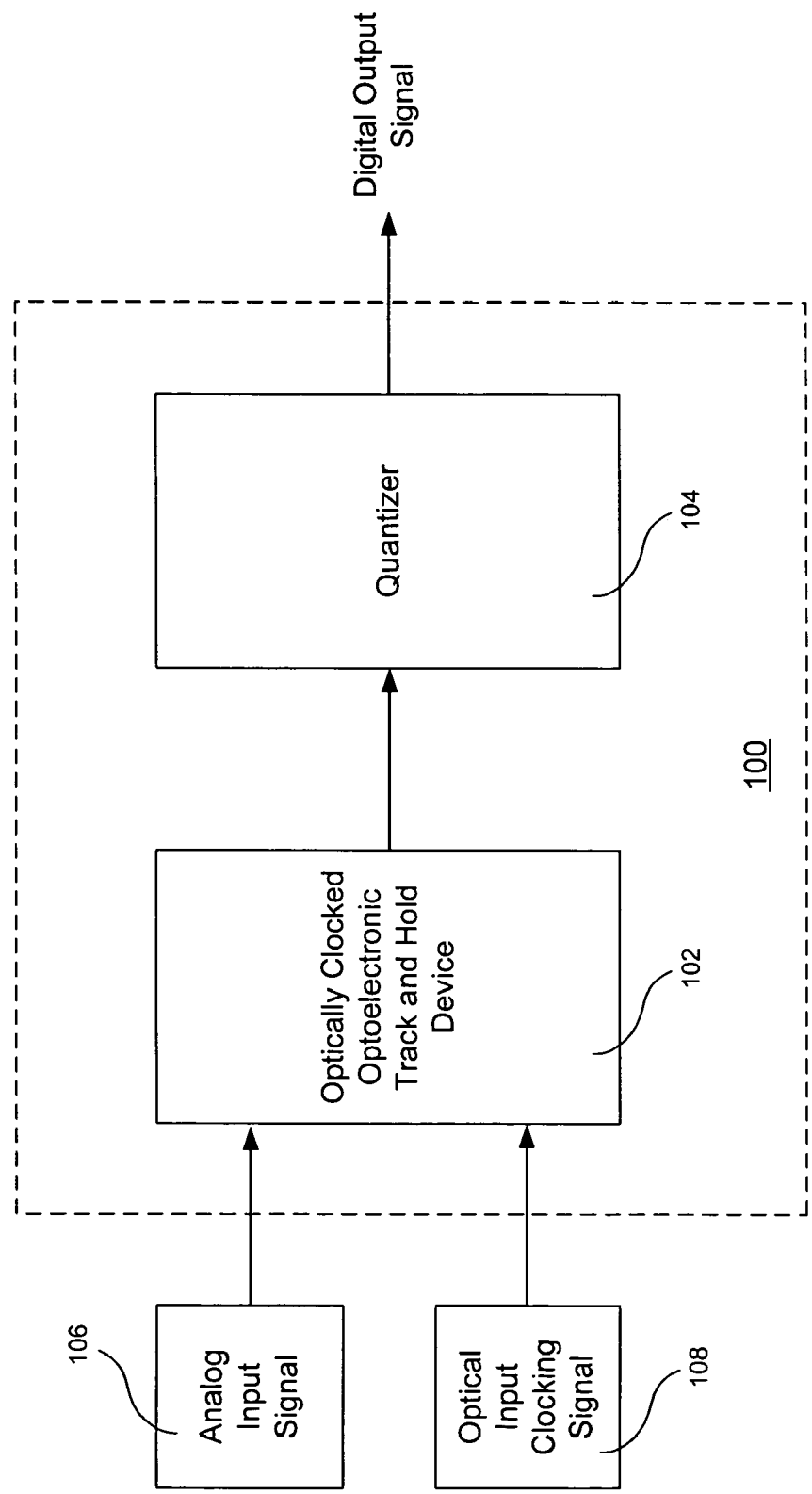
FIG. 1 is a block diagram representing an exemplary analog-to-digital converter.

FIG. 1 is a block diagram representing an exemplary analog-to-digital converter. As shown in FIG. 1, analog-to-digital converter ("ADC") 100 includes optically clocked optoelectronic track and hold ("OCOETH") device 102 and quantizer 104. OCOETH device 102 receives optical input clocking signal 108 and analog input signal 106. ADC 100 outputs a digital output signal comprising a discrete sequence of measured values, which represents analog input signal 106 measured at time intervals that are based on optical input clocking signal 108. Optical input clocking signal 108 comprises a sequence of optical pulses (i.e., pulses of light). In one embodiment, optical input clocking signal 108 comprises a sequence of optical pulses having a uniform rate. OCOETH device 102 includes at least one optoelectronic switch (e.g., photodiode) capable of switching OCOETH device 102 from a track mode to a hold mode. When operating in track mode, OCOETH device 102 measures an analog signal. In one embodiment, when operating in track mode, OCOETH device 102 continuously measures analog input signal 106. When operating in hold mode, OCOETH device 102 holds the measured value of analog input signal 106. Quantizer 104 receives held measured values of analog input signal 106 and converts held measured values to multiples of a basic unit. Quantizer 104 outputs a digital output signal, which can be further processed by known signal processing devices. An exemplary embodiment of OCOETH device 102 is described in detail with reference to FIG. 2.

Figure 2:
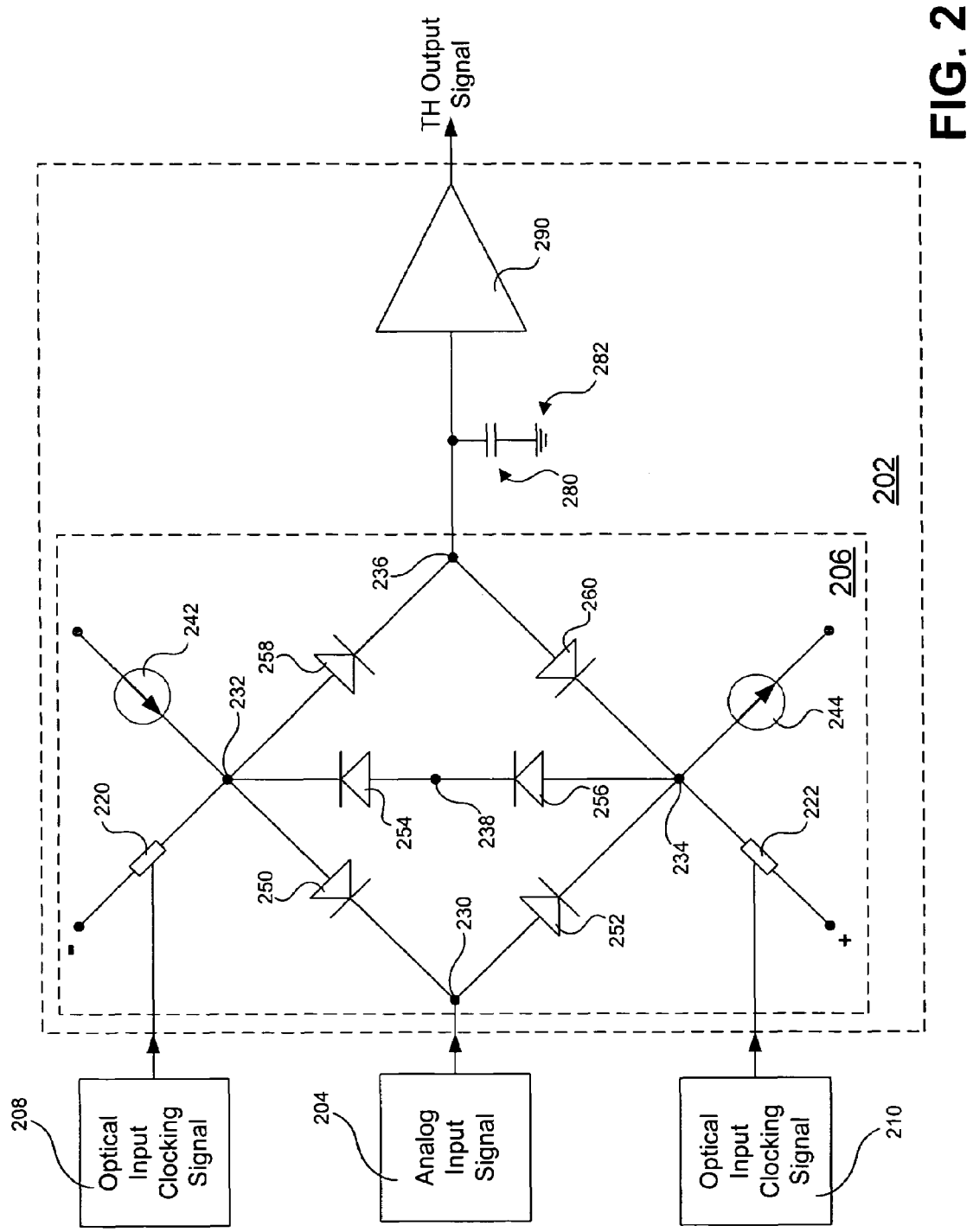
FIG. 2 is an exemplary embodiment of an optically clocked optoelectronic track and hold device.

FIG. 2 is an exemplary embodiment of an optically clocked optoelectronic track and hold device. As shown in FIG. 2, optically clocked optoelectronic track and hold device 202 includes OCOETH bridge circuit 206, hold capacitor 280, ground 282 and amplifier 290. OCOETH device 202 receives analog input signal 204, optical input clocking signals 208 and 210 and outputs a track and hold ("TH") output signal. OCOETH bridge circuit 206 includes photodiodes 220 and 222, current sources 242 and 244 and diodes 250, 252, 254, 256, 258 and 260. In one embodiment, the current sources 242 and 244 are a resistor of relatively high value operatively coupled to diodes 250, 252, 254, 256, 258 and 260, which form a diode bridge, and operatively coupled to a voltage source. Photodiodes 220 and 222 receive optical input clocking signals 208 and 210, respectively, by known means such as fiber optic cable coupled to an optical clock pulser. In one embodiment, optical input clocking signals 208 and 210 are generated from a pulsed laser. In one embodiment, optical input clocking signals 208 and 210 are synchronized so that photodiodes 220 and 222 receive substantially similar optical input signals. In one embodiment, photodiodes 220 and 222 are in the "on-state" when illuminated by an optical pulse because photodiodes 220 and 222 generate photocurrent. Similarly, photodiodes 220 and 222 are in the "off-state" when not illuminated because photodiodes 220 and 222 remain in a high impedance state (i.e., do not generate photocurrent). One skilled in the art shall recognize that photodiodes 220 and 222 can be replaced by other types of photodetectors without departing from the scope or spirit of the present invention. OCOETH bridge circuit 206 receives analog input signal 204 via node 230. In one embodiment, analog input signal 204 is input to OCOETH bridge circuit 206 via an input buffer amplifier. Diodes 250, 252, 254, 256, 258 and 260 are configured to form a diode bridge. Specifically, diode 250 is operatively coupled to nodes 232 and 230; diode 252 is operatively coupled to nodes 230 and 234; diode 256 is operatively coupled to nodes 234 and 238; diode 254 is operatively coupled to nodes 238 and 232; diode 258 is operatively coupled to nodes 232 and 236; and diode 260 is operatively coupled to nodes 236 and 234. Photodiode 220 includes a cathode and an anode. The cathode of photodiode 220 is operatively coupled to node 232 and the anode of photodiode 220 is operatively coupled to a node having a negative potential so that photodiode 220 is reverse biased. Current source 242 is operatively coupled to node 232 and produces current flow toward node 232. Photodiode 222 includes an anode and a cathode. The anode of photodiode 222 is operatively coupled to node 234 and the cathode of photodiode 222 is operatively coupled to a node having a positive potential so that photodiode 222 is reverse biased. Photodiodes 220 and 222 can be reverse biased by, for example, voltage sources. Current source 244 is operatively coupled to node 234 and produces current flow away from node 234. OCOETH bridge circuit 206 is operatively coupled to hold capacitor 280 and amplifier 290 via node 236. Hold capacitor 280 is operatively coupled to ground 282. Amplifier 290 buffers voltages on hold capacitor 280 and outputs a TH output signal, which can be further processed by devices such as quantizer 104 of FIG. 1.

OCOETH device 202 operates in either a track mode or a hold mode depending on optical input clocking signals 208 and 210. Optical input clocking signals 208 and 210 operate in parallel to periodically illuminate photodiodes 220 and 222, respectively. When photodiodes 220 and 222 are in an off-state, current sources 242 and 244 forward bias the diode bridge formed by diodes 250, 252, 254, 256, 258 and 260. Thus, analog input signal 204 is received at node 230 and tracked at node 236. Voltages of analog input signal 204 are tracked by hold capacitor 280. To switch from track mode to hold mode, optical input clocking signals 208 and 210 illuminate photodiodes 220 and 222, respectively, which causes photodiodes 220 and 222 to rapidly switch to an on-state. When photodiodes 220 and 222 switch to an on-state, the diode bridge formed by diodes 250, 252, 254, 256, 258 and 260 switches to reverse biased, node 236 is isolated from other diode bridge nodes, and the voltage at node 236 is held by hold capacitor 280. OCOETH device 202 switches from hold mode to track mode when the photocurrent generated by photodiodes 220 and 222 drops to a level so that current sources 242 and 244 forward bias the diode bridge.

In accordance with the invention, optical pulses are capable of rapidly reverse biasing the diode bridge via photodiodes 220 and 222. In accordance with the present invention, photodiodes 220 and 222 generate photocurrent having fast rise times and long fall times, which rapidly reverse bias the diode bridge. In one embodiment, photodiodes 220 and 222 are long transit time photodiodes having long I regions. In one embodiment, photodiodes 220 and 222 each include long and short transit time photodiodes in parallel configuration. Exemplary photodiodes are described in detail below with reference to FIGS. 5a and 5b. A graphical representation showing the operation of an exemplary OCOETH device is described in detail below with reference to FIG. 6.

An exemplary embodiment of OCOETH bridge circuit 206 is now described. In the exemplary embodiment, diodes 250, 252, 254, 256, 258 and 260 are gallium-arsenide (GaAs) Schottky diodes having an on-resistance approximately equal to 35 ohms and an off-capacitance approximately equal to 10 fF (femto-Farads). Current sources 242 and 244 produce a direct current approximately equal to 5 mA (milliamps). Hold capacitor 280 has a capacitance approximately equal to 200 fF. Photodiode 220 is a PIN photodiode having long intrinsic regions, small capacitance (e.g., approximately equal to 20 fF) and a long transit time (e.g., 200 picoseconds). The pulsed laser is a 1.55 micron wavelength mode locked laser and photodiodes 220 and 222 are InP/InGaAs-based devices. Photodiodes 220 and 222 are substantially similar.

The exemplary embodiment of OCOETH bridge circuit 206 operates in the following manner. In track mode, photodiodes 220 and 222 are reverse bias at approximately 10 volts. Photodiodes 220 and 222 receive optical input clocking signals 208 and 210, respectively, via fiber optic cable coupled to an optical clock pulser. The optical clock pulser illuminates photodiodes 220 and 222 with optical pulses having a peak power approximately equal to 1 Watt and FWHM (i.e., full width, half maximum) approximately equal to 2.5 picoseconds ("ps"). Upon illumination by an optical pulse, photodiodes 220 and 222 produce nominally triangular-shaped photocurrent pulses having a rise time approximately equal to 10 ps, a fall time approximately equal to 200 ps and a peak current approximately equal to 15 mA. The diode bridge switches from forward bias (i.e., OCOETH device 202 in track mode) to reverse bias (i.e., OCOETH device 202 in hold mode) in an aperture time of approximately 10 ps. Thus, OCOETH device 202 switches from track mode to hold mode approximately 10 ps after photodiodes 220 and 222 receive an optical pulse and remains in hold mode for approximately 150 ps.

Figure 3:
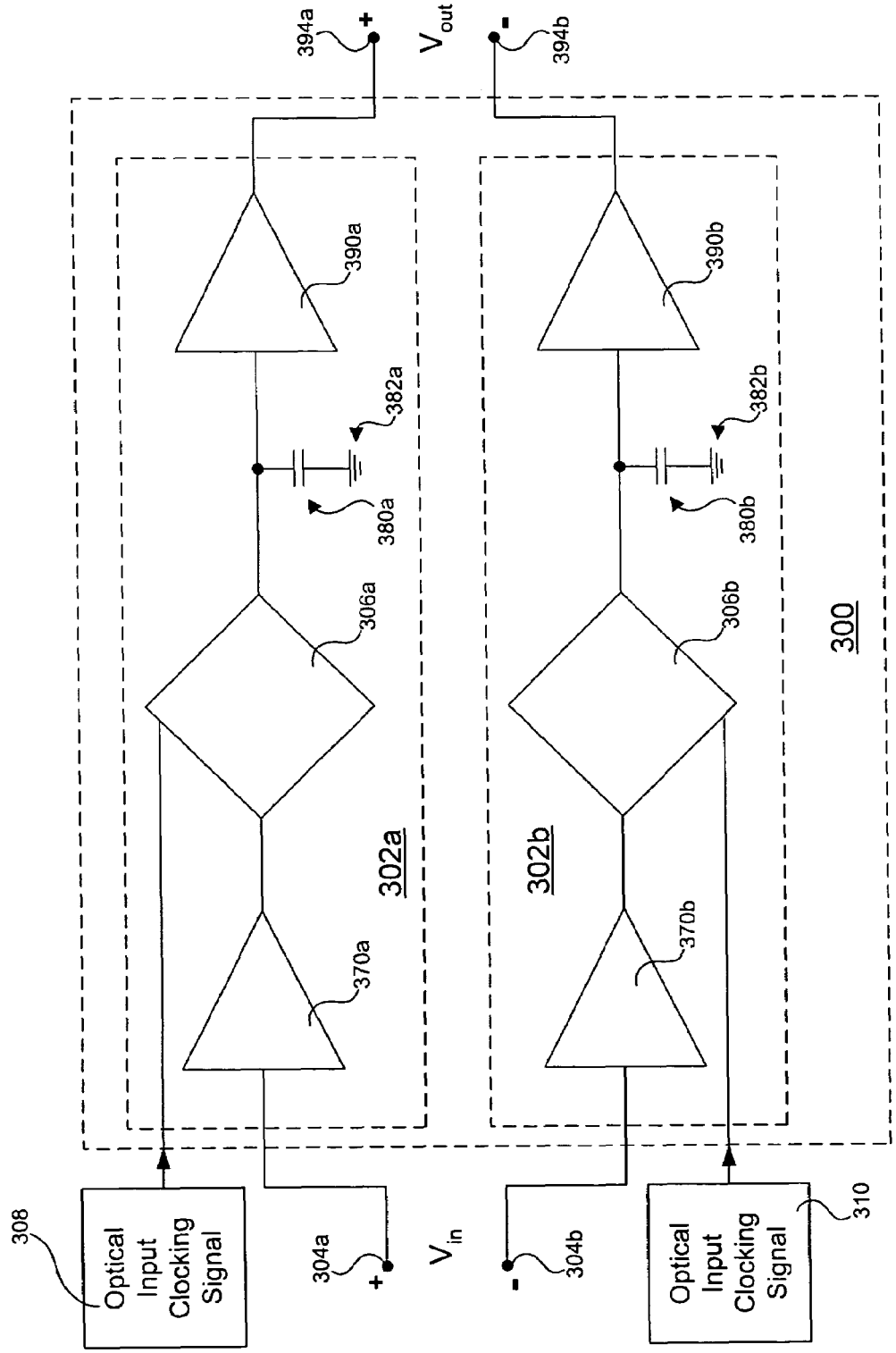
FIG. 3 is an exemplary application of an optically clocked optoelectronic track and hold device used in a differential circuit.

FIG. 3 is an exemplary application of an optically clocked optoelectronic track and hold device used in a differential circuit. The exemplary differential circuit application is capable of reducing or eliminating second and higher even order distortions. The exemplary differential circuit application inputs a differential analog input signal and outputs a differential analog output signal. As shown in FIG. 3, OCOETH differential circuit 300 includes positive node OCOETH device 302a and negative node OCOETH device 302b.

Positive node device 302a includes input buffer amplifier 370a, OCOETH bridge circuit 306a, hold capacitor 380a, ground 382a and output buffer amplifier 390a. Input buffer amplifier 370a receives analog input signals from positive node 304a. Input buffer amplifier 370a is operatively coupled to OCOETH bridge circuit 306a. OCOETH bridge circuit 306a receives analog input signals from input buffer amplifier 370a and optical input clocking signal 308. In one embodiment, OCOETH bridge circuit 306a is OCOETH bridge circuit 206 of FIG. 2. OCOETH bridge circuit 306a is operatively coupled to hold capacitor 380a and output buffer amplifier 390a. OCOETH bridge circuit 306a inputs signals to hold capacitor 380a and output buffer amplifier 390a. Hold capacitor 380a is operatively coupled to output buffer amplifier 390a and ground 382a. Output buffer amplifier 390a inputs a TH output signal to positive output node 394a. OCOETH bridge circuit 306a, hold capacitor 380a, ground 382a and output buffer amplifier 390a operate in a substantially similar manner to OCOETH device 202 of FIG. 2, and thus, is not described hereinagain.

Negative node device 302b includes input buffer amplifier 370b, OCOETH bridge circuit 306b, hold capacitor 380b, ground 382b and output buffer amplifier 390b. Input buffer amplifier 370b receives analog input signals from negative node 304b, which are inverted relative to and substantially similar to analog input signals received from positive node 304a. Input buffer amplifier 370b is operatively coupled to OCOETH bridge circuit 306b. OCOETH bridge circuit 306b receives analog input signals from input buffer amplifier 370b and optical input clocking signal 310. In one embodiment, OCOETH bridge circuit 306b is OCOETH bridge circuit 206 of FIG. 2. OCOETH bridge circuit 306b is operatively coupled to hold capacitor 380b and output buffer amplifier 390b. OCOETH bridge circuit 306b inputs signals to hold capacitor 380b and output buffer amplifier 390b. Hold capacitor 380b is operatively coupled to output buffer amplifier 390b and ground 382b. Output buffer amplifier 390b inputs a TH output signal to negative output node 394b. OCOETH bridge circuit 306b, hold capacitor 380b, ground 382b and output buffer amplifier 390b operate in a substantially similar manner to OCOETH device 202 of FIG. 2, and thus, is not described hereinagain. Nodes 394a and 394b output a differential output signal.

Figure 4:
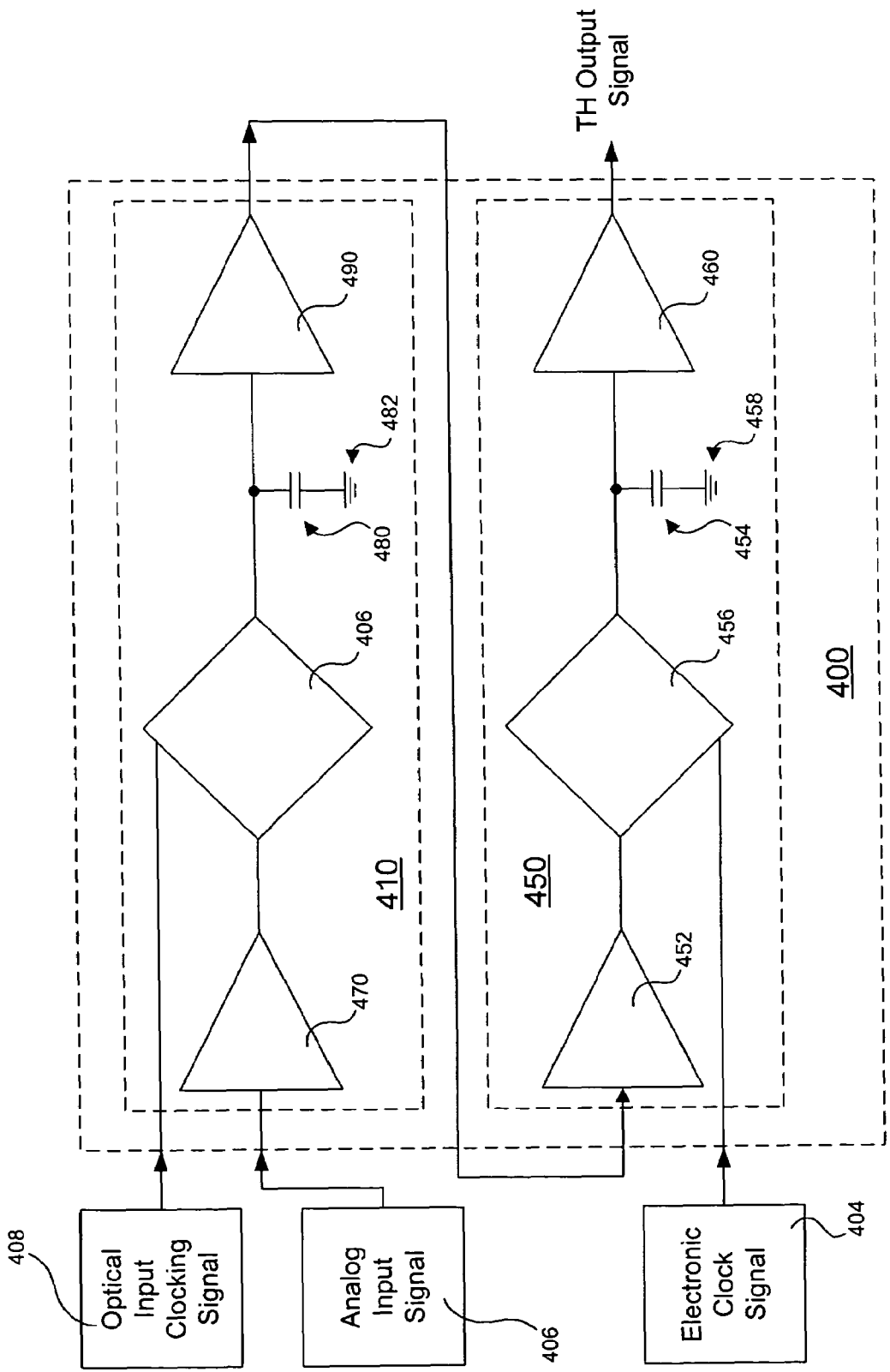
FIG. 4 is an exemplary application of an optically clocked optoelectronic track and hold device used in conjunction with an electronic track and hold device.

FIG. 4 is an exemplary application of an optically clocked optoelectronic track and hold device used in conjunction with an electronic track and hold device. The exemplary application of FIG. 4 is a two-stage track and hold device including an optically clocked optoelectronic track and hold device and an electronic track and hold device in a series configuration. The optically clocked optoelectronic track and hold device has short aperture time and low aperture jitter. The electronic track and hold device can have increased aperture time and aperture jitter because the purpose of the electronic track and hold device is to extend a hold signal from a first stage TH device (i.e., optically clocked optoelectronic track and hold device). In one embodiment, the two-stage track and hold device is fabricated on a single chip. In one embodiment, the two-stage track and hold device is fabricated on more than one chip. The exemplary application of FIG. 4 is particularly useful for holding output voltages for subsequent processing such as quantization. As shown in FIG. 4, two-stage TH device 400 includes OCOETH stage 410 and electronic TH stage 450.

OCOETH stage 410 includes input buffer amplifier 470, OCOETH bridge circuit 406, hold capacitor 480, ground 482 and output buffer amplifier 490. OCOETH stage 410 receives analog input signal 406 and optical input clocking signal 408. OCOETH stage 410 is substantially similar to positive node device 302a of FIG. 3, and thus, identical components and operation are not described in detail hereinagain. OCOETH stage 410 inputs a first TH output signal to electronic TH stage 450.

Electronic TH stage 450 includes input buffer amplifier 452, electronic TH bridge circuit 456, hold capacitor 454, ground 458 and output buffer amplifier 460. Electronic TH stage 450 receives the TH output signal via input buffer amplifier 452. Those of ordinary skill in the art shall recognize that either output buffer amplifier 490 or input buffer amplifier 452 can be removed from TH device 400 without departing from the scope or spirit of the present invention. Input buffer amplifier 452 is operatively coupled to electronic TH bridge circuit 456. Electronic TH bridge circuit 456 receives the first TH output signals from input buffer amplifier 452 and electronic clock signal 404. Electronic TH bridge circuits are well known in the art, and thus, are not described herein. Electronic TH bridge circuit 456 is operatively coupled to hold capacitor 454 and output buffer amplifier 460. Electronic TH bridge circuit 454 inputs signals to hold capacitor 454 and output buffer amplifier 460. Hold capacitor 454 is operatively coupled to output buffer amplifier 460 and ground 458. Output buffer amplifier 460 inputs a second TH output signal to subsequent signal processing devices such as a quantizer. In one embodiment, a differential dual track and hold circuit can be designed by combining the optically clocked optoelectronic track and hold device used in a differential circuit of FIG. 3 and the optically clocked optoelectronic track and hold device used in conjunction with an electronic track and hold device of FIG. 4.

FIG. 5A is an exemplary photodiode that can be used to implement an optically clocked optoelectronic track and hold device. The exemplary photodiode of FIG. 5A is a short transit time photodiode and a long transit time photodiode in a parallel configuration. The exemplary photodiode of FIG. 5A helps reduce transition time from track mode to hold mode in an OCOETH bridge circuit such as OCOETH bridge circuit 206 of FIG. 2. As shown in FIG. 5A, photodiode 510 includes P region 520, I region 522, N region 524, P region 530, I region 532 and N region 534, which form a short transit time photodiode and a long transit time photodiode. The short transit time photodiode includes P region 520, I region 522 and N region 524. The long transit time photodiode includes P region 530, I region 532 and N region 534. In one embodiment, photodiode 510 comprises InP and InGaAs. The short transit time photodiode and the long transit time photodiode of photodiode 510 have similar quantum efficiencies and are configured in parallel. P region 520 is operatively coupled to P region 530 and a node. N region 524 is operatively coupled to N region 534 and a node. Photodiode 510 can be uniformly illuminated (i.e., light transmission equally received on active region of photodiode) via an optical pulse. As shown in FIG. 5A, an optical pulse is represented by arrows.

Photodiode 510 of FIG. 5A operates in either an on-state or an off-state. To switch from an off-state to an on-state, photodiode 510 is illuminated by an optical pulse. As shown in FIG. 5A, an optical pulse uniformly illuminates the active regions (i.e., I regions 522 and 532) of the short and long transit time photodiodes. In the long transit time photodiode, the optical pulse generates a small photocurrent having a long duration. In the short transit time photodiode, the optical pulse generates a large photocurrent having a short duration. Thus, the photodiode 510 switches from an off-state to an on-state in a relatively short time. When used in OCOETH bridge circuits such as OCOETH bridge circuit 206 of FIG. 2, photodiode 510 provides extremely fast track-to-hold transitions.

FIG. 5B is an exemplary photodiode that can be used to implement an optically clocked optoelectronic track and hold device. The exemplary photodiode of FIG. 5B is a short transit time photodiode and a long transit time photodiode in a parallel configuration. The exemplary photodiode of FIG. 5B helps reduce transition time from hold mode to track mode and vice versa when used in OCOETH bridge circuits such as OCOETH bridge circuit 206 of FIG. 2. As shown in FIG. 5B, photodiode 550 includes N region 560, I region 562, P region 570, I region 572 and N region 574, which form a short transit time photodiode and a long transit time photodiode. The short transit time photodiode includes N region 560, I region 562 and P region 570. The long transit time photodiode includes P region 570, I region 572 and N region 574. In one embodiment, photodiode 550 comprises InP and InGaAs. The short transit time photodiode and the long transit time photodiode of photodiode 520 have similar quantum efficiencies and are configured in parallel. P region 570 is operatively coupled to a node. In one embodiment, P region 570 is a narrow Schottky diode stripe. N region 560 is operatively coupled to N region 574 and a node. Photodiode 550 can be focus illuminated (i.e., light transmission concentrated on a particular region of the photodiode) via an optical pulse. As shown in FIG. 5B, an optical pulse is represented by arrows. In one embodiment, a microlens is used to focus illuminate I region 572 of photodiode 550 near the junctions between P region 570 and N region 574.

Photodiode 550 of FIG. 5B operates in either an on-state or an off-state. In transition from an off-state to an on-state, photodiode 550 operates in a substantially similar manner to photodiode 510 of FIG. 5A, and thus, is not described again herein. However, in transition from an on-state to an off-state, photodiode 550 can provide an extended forward bias time and a fast transition time to a diode bridge to which it is operatively coupled. For example, an extended forward bias time and a fast transition time occurs after I region 572 of photodiode 550 is focus illuminated near the junctions between P region 570 and N region 574. When used in OCOETH bridge circuits such as OCOETH bridge circuit 206 of FIG. 2, photodiode 510 provides extremely fast hold-to-track and track-to-hold transitions.

Figure 6:
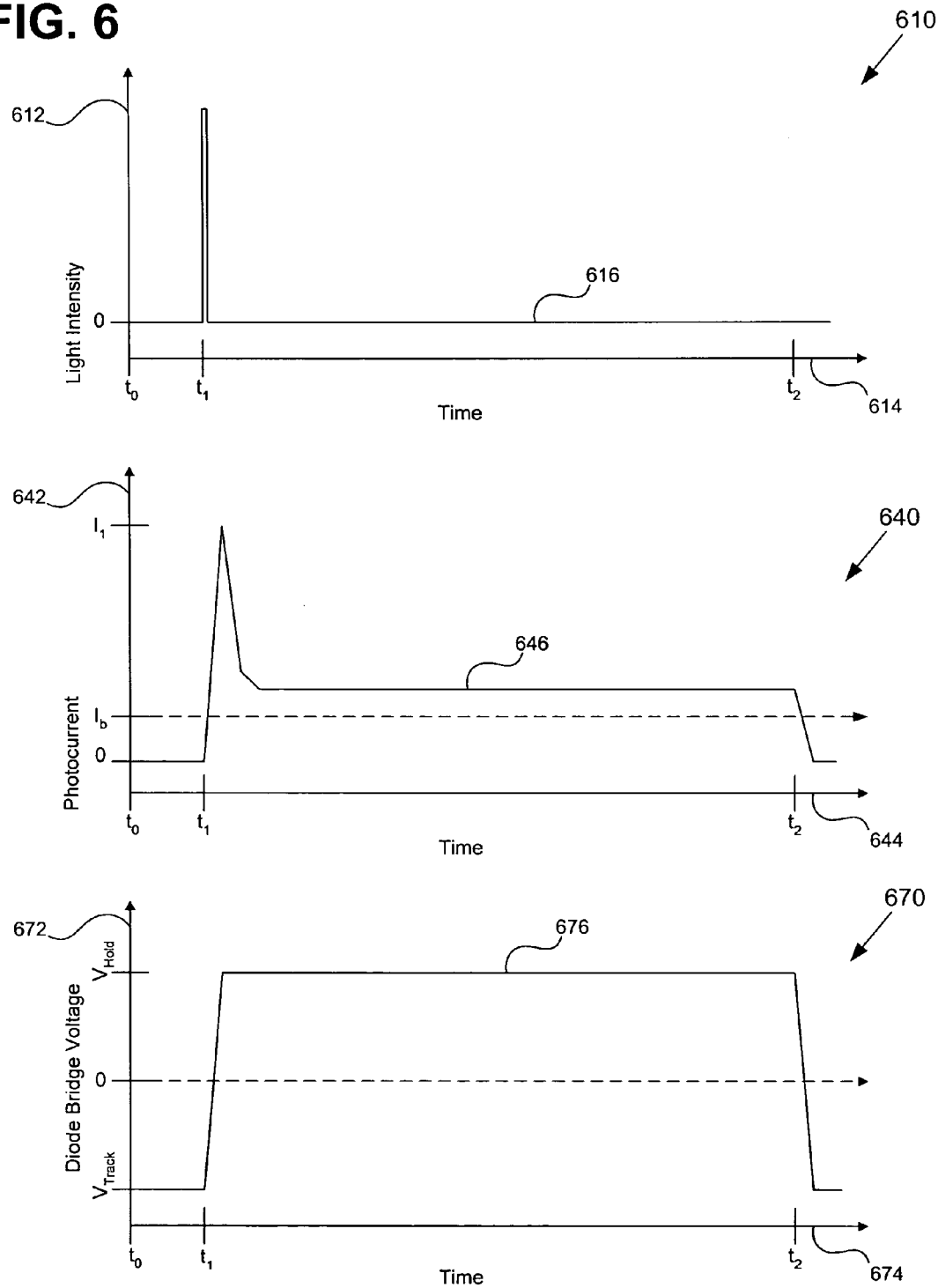
FIG. 6 is a graphical representation showing the operation of an exemplary OCOETH device.

FIG. 6 is a graphical representation showing the operation of an exemplary OCOETH device. FIG. 6 includes three graphical representations: optical input clocking signal graph 610, photodiode photocurrent graph 640 and diode bridge voltage graph 670. Optical input clocking signal graph 610 represents an optical input clocking signal such as optical input clocking signal 210 of FIG. 2. Photodiode photocurrent graph 640 represents photocurrent generated by an exemplary photodiode such as photodiode 550 of FIG. 5B. Diode bridge voltage graph 670 represents diode bridge voltage (i.e., the voltage between nodes 232 and 234 of FIG. 2 where $V_{Hold}$ is equal to minus two times the forward bias voltage drop across one of the bridge diodes, and $V_{Track}$ is equal to plus two times the forward bias voltage drop across one of the bridge diodes) of an exemplary diode bridge such as the diode bridge of FIG. 2.

As shown in FIG. 6, optical input clocking signal graph 610 includes light intensity axis 612, time axis 614 and optical input clocking signal 616. At time t0, optical input clocking signal 616 does not include an optical pulse, and thus, has zero light intensity. At time $t_1$, optical input clocking signal 616 includes a fast optical pulse, and thus, has a light intensity greater than zero.

As shown in FIG. 6, photodiode photocurrent graph 640 includes photocurrent axis 642, time axis 644 and photodiode photocurrent 646. In response to receiving an optical pulse (at approximately time $t_1$), photodiode photocurrent 646 of an exemplary photodiode sharply rises from zero to $I_1$, which is greater than diode bridge bias current $I_b$. Subsequently, photodiode photocurrent 646 sharply drops to a level that is above $I_b$ and remains above $I_b$ until time $t_2$. After time $t_2$, photodiode photocurrent 646 drops to zero amps.

As shown in FIG. 6, diode bridge voltage graph 670 includes diode bridge voltage axis 672, time axis 674 and diode bridge voltage 676. In response to photodiode photocurrent 646 exceeding diode bridge bias current $I_b$ (at approximately time $t_1$), diode bridge voltage 676 quickly changes from track voltage $V_{Track}$ to hold voltage $V_{Hold}$. While photodiode photocurrent 646 remains above diode bridge bias current $I_b$ (from approximately time $t_1$ to approximately time $t_2$), diode bridge voltage 676 remains at hold voltage $V_{Hold}$. In response to photodiode photocurrent 646 sharply dropping to zero amps (at approximately time $t_2$), diode bridge voltage 676 quickly changes from hold voltage $V_{Hold}$ to track voltage $V_{Track}$.

Figure 7:
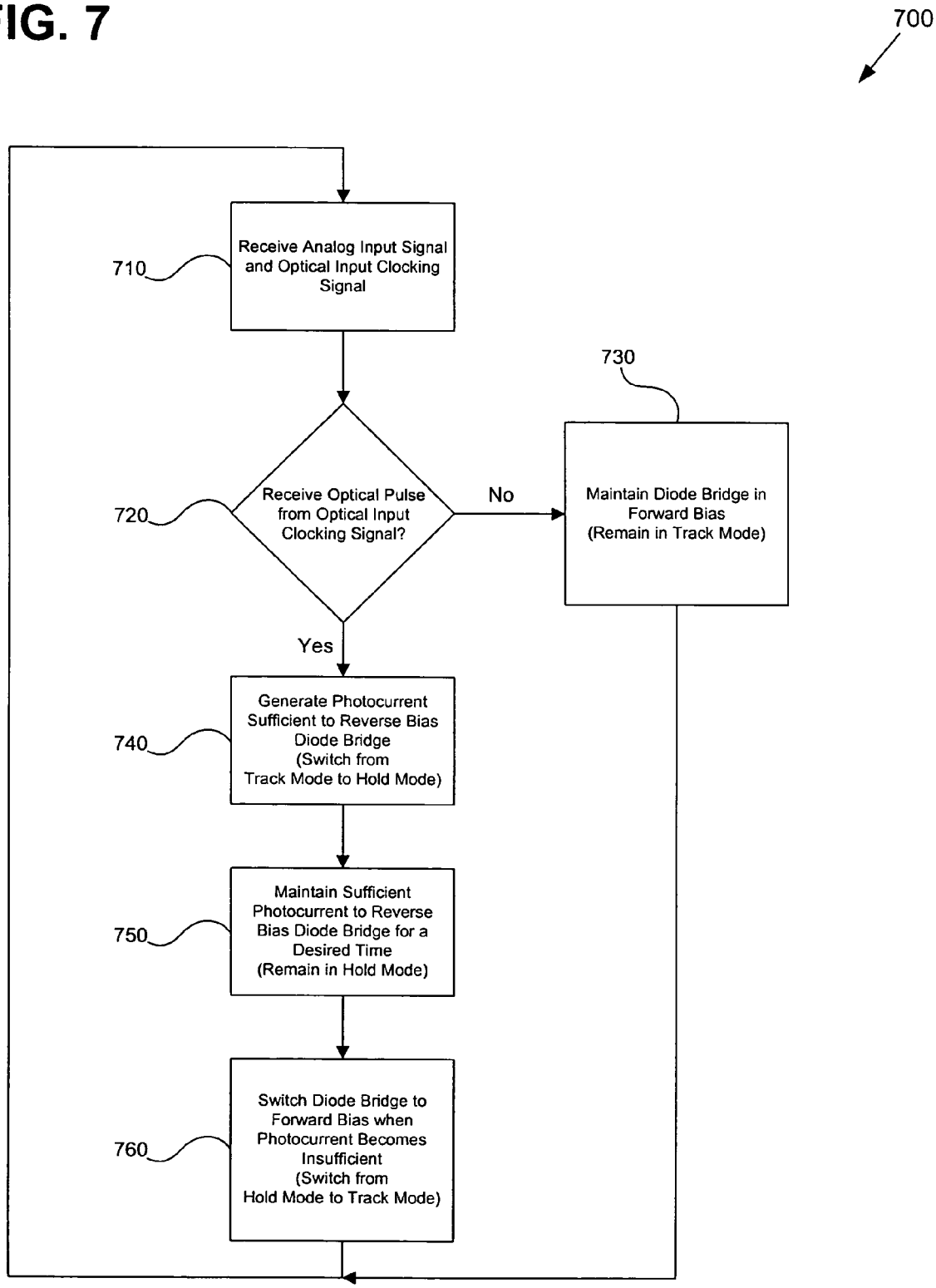
FIG. 7 is a flowchart of an exemplary method that implements an embodiment of the invention.

FIG. 7 is a flowchart of an exemplary method that implements an embodiment of the invention. Certain details and features have been left out of flowchart 700 of FIG. 7 that are apparent to a person of ordinary skill in the art. For example, a step may consist of one or more sub-steps or may involve specialized equipment or materials, as known in the art. While STEPS 710 through 740 shown in flowchart 700 are sufficient to describe one embodiment of the present invention, other embodiments of the invention may utilize steps different from those shown in flowchart 700.

Referring to FIG. 7, at STEP 710 in flowchart 700, the method receives an analog input signal and an optical input signal. In one embodiment, the method receives an analog input signal via a node of an OCOETH bridge circuit and an optical input clocking signal via at least two photodiodes of the OCOETH bridge circuit. After STEP 710, the method of flowchart 700 of FIG. 7 proceeds to decision STEP 720.

At STEP 720 in flowchart 700, the method determines whether an optical pulse is received from the optical input signal. In one embodiment, receiving an optical pulse via the optical input clocking signal indicates switching from track mode to hold mode and the absence of an optical pulse in the optical input clocking signal indicates remaining in track mode. If the method determines that an optical pulse is received from the optical input signal, the method proceeds to STEP 740, else the method proceeds to STEP 730.

At STEP 730 in flowchart 700, the method maintains a diode bridge of an OCOETH bridge circuit in forward bias, and thus, the circuit remains in track mode. The diode bridge is forward biased due to current sources. In one embodiment, the diode bridge is forward biased when the photocurrent of photodiodes of an OCOETH bridge circuit does not generate enough photocurrent to reverse bias the diode bridge. After STEP 730, the method of flowchart 700 of FIG. 7 returns to STEP 710.

At STEP 740 in flowchart 700, the method generates photocurrent sufficient to reverse bias the diode bridge, and thus, the circuit switches from track mode to hold mode. In one embodiment, the diode bridge is reverse biased when the optical input clocking signal illuminates photodiodes of an OCOETH bridge circuit, which quickly switches the photodiodes to an on-state. After STEP 740, the method proceeds to STEP 750.

At STEP 750 in flowchart 700, the method maintains sufficient photocurrent to reverse bias the diode bridge for a desired time, and thus, the circuit remains in hold mode. In one embodiment, the method uses a long transit time photodiode to maintain sufficient photocurrent for a desired time. The desired time is a function of the properties of the long transit time photodiode, and thus, other desired times can be achieved by using other long transit time photodiodes. After STEP 750, the method proceeds to STEP 760.

At STEP 760 in flowchart 700, the method switches the diode bridge to forward bias when the photocurrent becomes insufficient to maintain the diode bridge in reverse bias, and thus, the circuit switches from hold mode to track mode. After STEP 760, the method of flowchart 700 of FIG. 7 returns to STEP 710.

From the above description of the invention, it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

We claim:

1. An optically clocked optoelectronic track and hold apparatus, comprising:
   a. a diode bridge comprising a first node, a second node, a third node, a fourth node and a plurality of diodes, wherein said plurality of diodes comprises:
      i. a first diode having a cathode operatively coupled to said first node and an anode operatively coupled to said second node;
      ii. a second diode having a cathode operatively coupled to said third node and an anode operatively coupled to said first node;
      iii. a third diode having a cathode operatively coupled to said fourth node and an anode operatively coupled to said second node;
      iv. a fourth diode having a cathode operatively coupled to said third node and an anode operatively coupled to said fourth node;
   b. an input node, operatively coupled to said first node of said diode bridge, capable of receiving an analog input signal;
   c. a first current source, operatively coupled to said second node of said diode bridge and a second current source, operatively coupled to said third node of said diode bridge, and wherein said first and second current sources are capable of forward biasing said diode bridge;
   d. a first photodetector having a cathode operatively coupled to said second node and an anode operatively coupled to a negative potential node and a second photodetector having an anode operatively coupled to said third node and a cathode operatively coupled to a positive potential node, and wherein said first and second photodetectors are capable of receiving an optical input clocking signal, and capable of reverse biasing and forward biasing said diode bridge in response to said optical input clocking signal, wherein a photodetector of said first and second photodetectors comprises a short transit time photodiode and a long transit time photodiode in a parallel configuration;
   e. a hold capacitor, operatively coupled to said fourth node, capable of tracking said analog input signal when said diode bridge is forward biased, and capable of holding said analog input signal when said diode bridge switches from forward biased to reverse biased.

2. The optically clocked optoelectronic track and hold apparatus of claim 1, wherein said short transit time photodiode and said long transit time photodiode are focus illuminated in I regions near junctions between P regions and N regions.

3. A method for optically clocked optoelectronic tracking and holding, the method comprising the steps of:
   a. receiving an analog input signal and an optical input clocking signal;
   b. determining whether an optical pulse is received by at least two photodetectors from said optical input clocking signal;
   c. maintaining a diode bridge in forward bias and returning to STEP (a) if said optical pulse is not received from said optical input clocking signal;
   d. switching said diode bridge to reverse bias for a desired time and returning to STEP (a) if said optical pulse is received from said optical input clocking signal.

4. The method of claim 3, wherein said switching said diode bridge to reverse bias for a desired time step comprises the following sub-steps:
   i. generating photocurrent sufficient to reverse bias said diode bridge if said optical pulse is received from said optical input clocking signal;
   ii. maintaining sufficient photocurrent to reverse bias said diode bridge for said desired time;
   iii. switching said diode bridge to forward bias when photocurrent becomes insufficient to reverse bias said diode bridge;
   iv. returning to STEP (a) of claim 3.

5. The method of claim 3, wherein said maintaining diode bridge in forward bias step comprises forward biasing said diode bridge by said at least two photodetectors not generating enough photocurrent.

6. The method of claim 3, wherein said switching said diode bridge to reverse bias for said desired time step comprises reverse biasing said diode bridge by said at least two photodetectors quickly switching to an on-state.

7. The method of claim 3, wherein said switching said diode bridge to reverse bias for said desired time step uses a long transit time photodiode to maintain sufficient photocurrent for said desired time.

8. An optically clocked optoelectronic track and hold apparatus, comprising:
   a. means for receiving an analog input signal and an optical input clocking signal;
   b. means for determining whether an optical pulse is received by at least two photodetectors from said optical input clocking signal;
   c. means for maintaining a diode bridge in forward bias if said optical pulse is not received from said optical input clocking signal;
   d. means for switching said diode bridge to reverse bias for a desired time if said optical pulse is received from said optical input clocking signal.

* * * * *